Figure 1A:
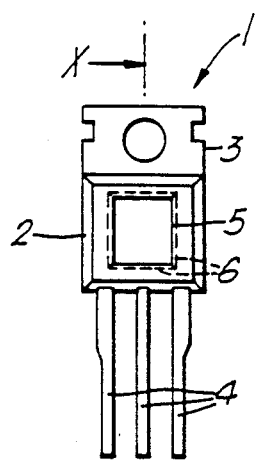

United States Patent [19]

Titterington

[11] Patent Number: 4,965,642

[45] Date of Patent: Oct. 23, 1990

[54] SEMICONDUCTOR DEVICE HAVING A LASER PRINTABLE ENVELOPE

[75] Inventor: Joseph B. Titterington, Stockport, England

[73] Assignee: U.S. Philips Corporation, New York, N.Y.

[21] Appl. No.: 851,838

[22] Filed: Apr. 14, 1986

[30] Foreign Application Priority Data

Apr. 22, 1985 [GB] United Kingdom ............... 8510200

[51] Int. Cl.$^5$ ...................... H01L 23/28; H01L 23/30
[52] U.S. Cl. ......................... 357/72; 357/74; 357/68
[58] Field of Search .............. 357/72, 73, 68, 67, 357/84; 174/52 FD; 427/53.1, 96

[56] References Cited

U.S. PATENT DOCUMENTS

| | | | |
|---|---|---|---|
| 4,337,182 | 6/1982 | Needham | 357/72 |
| 4,560,580 | 12/1985 | Needham et al. | 427/53.1 |
| 4,654,225 | 3/1987 | Needham et al. | 427/53.1 |

FOREIGN PATENT DOCUMENTS

| | | | |
|---|---|---|---|
| 59-96749 | 6/1984 | Japan | 174/52 FP |
| 59-175751 | 10/1984 | Japan | 357/72 |
| 0018941 | 1/1985 | Japan | 357/73 |

*Primary Examiner*—Rolf Hille
*Assistant Examiner*—S. V. Clark
*Attorney, Agent, or Firm*—Norman N. Spain

[57] ABSTRACT

Laser printing is used to print information relating to, for example, device characteristics on the envelope of a semiconductor device. Where that envelope is of plastics material of sufficiently high purity to be acceptable as an encapsulation, the contrast of the laser printed areas can be low when compared with the unprinted areas. In a laser printable envelope in accordance with the invention an insert (5) is introduced into a plastics encapsulation (2) and the surface (7) of the insert provides a surface for the envelope which is capable of receiving laser printing at high contrast in comparison to the external surface of the encapsulation. The insert is separated from the semiconductor element 10 and connecting wires 11 by a part 12 of the encapsulation. The insert may be of laminated structure, for example Formica (Trade Mark).

6 Claims, 1 Drawing Sheet

SEMICONDUCTOR DEVICE HAVING A LASER PRINTABLE ENVELOPE

The invention relates to semiconductor devices having laser printable envelopes, and to semiconductor devices in which information relating to the device is laser printed on an external surface of the envelope.

Information relating to the manufacture, type and rating of a semiconductor device may be found on the envelope of a semiconductor device. Hitherto, this information has been printed on the envelope by known printing techniques using inks. The permanence of this printing is affected by, inter alia, the strength of adherence of the ink to the envelope. The strength of adherence gives a measure of the ability of the ink to resist damage during post printing processing of the device.

The exterior of the envelope may include part of the external surface of an encapsulation formed about a semiconductor element. The encapsulation may be a plastics material. Improvements in the purity of plastics encapsulation material has, however, adversely affected the strength of the adherence of printing inks to the plastics material and as a result other types of printing techniques have been employed to give a more permanent result. One widely used among these other types of printing techniques is laser printing and printing apparatus using this technique commonly uses the 10.6 micrometer wavelength radiation from a $CO_2$ laser to print onto the plastics material through an appropriate mask.

The time required to perform the laser printing of a semiconductor device envelope is of the order of 1 microsecond, and devices can be processed at a rate of 10 per second by an existing single-laser printing apparatus. A laser printing apparatus may be incorporated into an automatic test and mark apparatus, so that semiconductor devices may be electrically tested to determine their electrical characteristics and then have information relating to those characteristics marked on them by laser printing as a subsequent processing step.

The mechanism by which laser radiation affects the surface of plastics material is not fully understood, but it must be realised that a plastics material such as used for the encapsulation of a semiconductor element is a complex mixture including polymer, fillers, colour pigments, flame retardants and mould release agents. It is known that the effect of laser radiation extends about 10 micrometers into the surface of such a plastics material. It has been proposed that the mechanism is a complex of chemical changes which may include the depolymerisation of the polymer or the decomposition of the colour pigments or both. The irradiated part of the surface is of a different colour to the surrounding plastics material due to the change of colour in the depolymerised polymer and the decomposed pigment and the possibility that the colour of the filler may also show. Further, the contrast between the laser irradiated part and the surroundings may be enhanced by a change in the reflectivity of the irradiated part. Plastics materials, for example thermoplastics materials, which have been adapted to receive laser printing and provide a higher contrast image than known encapsulations are available but may not be suitable for use as semiconductor element encapsulations due to the presence of certain ionic species which may migrate through the plastics material, especially under conditions of high humidity, and for example may cause corrosion of aluminium connecting wires in integrated circuits and charge induced electrical changes to the surface of unpassivated semiconductor elements within an encapsulation. The requirement has therefore been to provide plastics material of high purity and correspondingly low ionic species concentration for use as encapsulation for semiconductor elements.

The applicant has found that when higher purity plastics materials normally acceptable to the semiconductor industry, such as thermosetting epoxy resins such as an anhydride epoxy resin or an epoxy novalac, Nitto HC 10/2, produced by Nitto Corporation of Japan, are used for encapsulation, the laser printed part of the encapsulation is of lower contrast with respect to the unprinted part of the encapsulation.

According to the invention there is provided a semiconductor device having a laser printable envelope, the envelope including an encapsulation of plastics material formed about a semiconductor element, the envelope having an exterior which includes an external surface of the encapsulation, characterised in that the envelope also includes in the encapsulation an insert separated from the semiconductor element by a part of the encapsulation, the insert having a major surface which forms a part of the exterior of the envelope and which is capable of receiving laser printing at high contrast in comparison to said external surface of the encapsulation.

The encapsulation may be moulded about the insert and the insert may have at least one beveled edge to secure it in the encapsulation.

The insert may be formed of a synthetic resinous material comprising a dye and a silicon-containing inorganic compound or a dye comprising silicon.

The insert may be of laminated structure, for example a paper-resin laminate such as a phenol formaldehyde or ureaformaldehyde laminate of the type available under the trade name Formica.

A semiconductor device according to the invention may have an envelope which has information relating to the semiconductor device laser printed on the major surface of the insert.

The surface of the insert (which may be a Formica laminate) undergoes a colour change when exposed to laser radiation at 10.6 micrometers. Where black or dark colour surfaced Formica is used the regions exposed to laser radiation appear to be bleached and stand out in high contrast to the unexposed regions. Where these regions take the form of written or other information about the semiconductor device the information is easily legible.

The laser printing on Formica has been found to resist damage during normal post printing device processing.

The inventor has found several unexpected benefits accruing from the use of Formica as the material for receiving the laser printing. First, the printing can be abraded to leave a fresh surface ready for the reception of further laser printing. This is a considerable advantage in the semiconductor manufacturing industry where products originally manufactured and marked for one outlet may have to be switched to another outlet requiring different markings. Second, the whole Formica surface may be bleached by exposure to the laser radiation to remove any laser printed information present or to make it unreceptive to laser printing or both. Third, the Formica insert may be less expensive than the volume of the encapsulation it displaces, especially where the encapsulation is a plastics material of high purity.

Figure 1B:
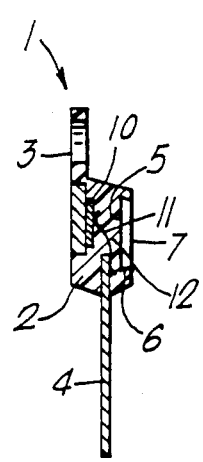

An embodiment of the invention will now be described, by way of example only, with reference to the drawings in which FIG. 1A shows schematically in plan a semiconductor device incorporating the invention, and FIG. 1B shows a view on X—X of FIG. 1A.

In FIGS. 1A and 1B a semiconductor device of TO-220 outline is indicated by arrows 1. The figures are not to scale. A black plastics encapsulation 2 is moulded over part of a heatsink 3, leads 4 and an insert 5. The plastics encapsulation 2 is formed of a high purity plastics material such as an epoxy thermosetting resin, for example an epoxy novalac resin Nitto HC 10/2 produced by Nitto Corporation of Japan or an anhydride epoxy resin. Although such plastics materials may char or brown on exposure to laser light of 10.6 micrometers wavelength from a $CO_2$ laser, no significant bleaching occurs and so high contrast laser printing is not possible on such plastics material. An envelope of the device comprises the encapsulation 2 and the insert 5. A semiconductor element 10 is mounted on the heatsink and connected to the leads by connecting wires 11 within the encapsulation. The insert 5 has bevelled edges 6 to secure it in the encapsulation and is separated from the semiconductor element by a part 12 of the encapsulation. The extent of the bevelled edges 6 are also shown in FIG. 1A by the dashed line surrounding insert 5. The outer surface 7 of the insert 5 is the surface on which laser radiation is received.

The insert 5 is formed of a material capable of receiving laser printing to provide print of high contrast.

The insert 5 may be formed of a synthetic resinous material comprising a dye and a silicon containing inorganic compound, or a dye comprising silicon. The synthetic resin may be, for example, polypropylene, polyethylene, polystyrene, acrylate, methacrylate or polyphenylene oxide and the dye may be, for example, ultramarine blue (pigment blue 29 C177007), ultramarine violet (pigment violet 15 C177007) or ultramarine red (pigment violet 15 C177007). As an example, in order to produce such a synthetic resinous insert, polypropylene may be mixed with 0.5% by weight of one of the pigments described above and moulded to produce the insert 5. Such synthetic resinous material bleach or turns white when exposed to laser light of 10.6 micrometers wavelength from of $CO_2$ laser, the reason for this being, it is thought, that the dye in the synthetic resinous material is decomposed when exposed to laser light but the silicon-containing inorganic compound remains behind in the form of a silicon-containing product which forms a good contrast with the original strong colour of the dye.

The insert 5 may be formed of a paper-resin laminate, for example laminate produced under the Trade Name Formica by the Formica Corporation. Such Formica is available in a variety of surface colours and high contrast printing is facilitated if black or dark coloured surfaced Formica is used. For example in the Formica Colorama range in a standard grade with a velour finish, the following colours are particularly suitable: tropical blue, spectrum green (7897), blaze red (2824), diamond black (2253), and ruby red (2283). The surface of the Formica undergoes a colour change when exposed to laser radiation at 10.6 micrometers. Thus, the exposed surface areas appear to be bleached or turn white, and so the white printing stands out in high contrast against the unexposed black or dark coloured surface regions. The laser printing on Formica has been found to resist damage during normal post printing device processing but can be abraded to leave a fresh surface ready for reception of further laser printing. Also, the whole surface of the Formica insert may be exposed and thus bleached to remove or prevent laser printing.

Of course, decorative laminates produced by other companies may be suitable and the following colours in the papago fini A range produced by Polyrey of France give good contrast printing (the exposed portions of the laminate surface again bleaching or turning white), namely: myosotis M92 (a blue), vert paime V23, hit rouge H07, bleu brière B42, bleu caraibes B96, Cèdre (a green colour) C43, and Coco (a chocolate brown colour) C60. Also the Polyrey decorative laminates identified as Papago C20 Cyprus (a green colour) and noir N05 give good results.

The semiconductor element is thus encapsulated in a high purity plastics material and is separated from the possibly deleterious effect of the laser printable insert by part of the plastics material interposed between the insert and the semiconductor element. There is a wide range of semiconductor elements which may be accommodated in a TO-220 outline.

Thus in FIGS. 1A and 1B a semiconductor element requiring three terminals, which may be a transistor, thyristor, gate-turn-off thyristor (GTO) etc. is shown. The TO-220 outline may also accommodate semiconductor elements requiring two terminals such as diodes. To facilitate the recognition of the various type of semiconductor elements within the same outline, the insert may be selected according to a particular colour code.

It is noted here that the descriptions of the embodiments given above are merely exemplary and modifications are possible within the scope of the invention. Thus, although the bonding of the insert may be achieved by moulding the encapsulation around it, the encapsulation may be moulded with a recess into which a laser printable insert may be glued.

I claim:

1. A semiconductor device provided with an envelope capable of displaying information upon laser printing, said device comprising a semiconductor element encapsulated in an envelope of a plastics material, said envelope having an exterior surface remote from said semiconductor element characterized in that an insert separated from the semiconductor element by a portion of the envelope is included in the envelope, said insert has a major surface forming a portion of the exterior surface of said envelope and is formed of a material which, upon laser printing, produces markings that are of high contrast to the remainder of the external surface of the envelope.

2. A semiconductor device as claimed in claim 1, in which the envelope is moulded about the insert.

3. A semiconductor device as claimed in claim 1, in which the insert is secured in the exterior surface of the envelope by having at least one bevelled edge.

4. A semiconductor device as claimed in claim 1, in which the insert is a laminate.

5. A semiconductor device as claimed in claim 4, in which the insert is a paper-resin laminate, in particular a laminate of the type available under the trade mark Formica.

6. A semiconductor device as claimed in claim 1, in which the envelope has information relating to the semiconductor device laser printed on said major surface of the insert.

* * * * *